United States Patent
Harman

[19]

[11] Patent Number: 5,900,071
[45] Date of Patent: May 4, 1999

[54] SUPERLATTICE STRUCTURES PARTICULARLY SUITABLE FOR USE AS THERMOELECTRIC MATERIALS

[75] Inventor: Theodore C. Harman, Lexington, Mass.

[73] Assignee: Massachusetts Institute of Technology, Cambridge, Mass.

[21] Appl. No.: 08/926,190

[22] Filed: Sep. 8, 1997

Related U.S. Application Data

[63] Continuation of application No. 08/672,684, Jun. 28, 1996, abandoned, which is a continuation of application No. 08/355,842, Dec. 14, 1994, abandoned, which is a continuation-in-part of application No. 08/002,451, Jan. 12, 1993, Pat. No. 5,415,699.

[51] Int. Cl.[6] .................................. H01L 35/12
[52] U.S. Cl. .................... 136/236.1; 136/239; 136/240; 136/238; 257/614
[58] Field of Search .................... 136/200, 201, 136/225, 236.1, 237, 238, 239, 240, 241; 257/22, 42, 108, 442, 467, 468, 469, 470, 614, 930

[56] References Cited

U.S. PATENT DOCUMENTS

| | | | |
|---|---|---|---|
| 2,588,254 | 3/1952 | Lark-Horovitz et al. | 136/89 |
| 2,798,989 | 7/1957 | Welker | 317/237 |
| 3,124,936 | 3/1964 | Melehy | 62/3 |
| 3,259,759 | 7/1966 | Giaever | 307/88.5 |
| 3,296,033 | 1/1967 | Scuro et al. | 136/205 |
| 3,338,753 | 8/1967 | Horsting | 136/237 |
| 3,342,567 | 9/1967 | Dingwall | 29/195 |
| 3,356,464 | 12/1967 | Hulliger | 23/315 |
| 3,626,583 | 12/1971 | Abbott et al. | 29/573 |
| 3,674,568 | 7/1972 | Caprarola | 136/205 |
| 3,721,583 | 3/1973 | Blakeslee | 117/215 |
| 3,873,370 | 3/1975 | Hampl, Jr. et al. | 136/205 |
| 4,029,520 | 6/1977 | Hampl, Jr. et al. | 136/205 |
| 4,088,515 | 5/1978 | Blakeslee et al. | 148/175 |
| 4,261,771 | 4/1981 | Dingle et al. | 148/175 |

(List continued on next page.)

FOREIGN PATENT DOCUMENTS

| | | |
|---|---|---|
| 0437654 | 7/1991 | European Pat. Off. . |
| 0476134 | 3/1992 | European Pat. Off. . |
| 1216001 | 12/1970 | United Kingdom . |

OTHER PUBLICATIONS

Database Inspec. Institute of Electrical Engineers, Stevenage, GB Inspec No. 4590534, Nov. 30, 1992, Hicks, L.D. and Dresselhaus, M.S., "Effects of Quantum–Well Structures on the Thermoelectric Figure of Merit"–pp. 12727–12731.

Patent Abstracts of Japan Pub. #63020880 Jan. 28, 1988, "Manufacture of Thermoelement for Electronic Wristwatch.".

(List continued on next page.)

*Primary Examiner*—Kathryn Gorgos
*Assistant Examiner*—Thomas H. Parsons
*Attorney, Agent, or Firm*—Baker & Botts, L.L.P.

[57] ABSTRACT

A superlattice structure comprising alternating layers of material such as $(PbEuTeSe)_m$ and $(BiSbn)_n$ where m and n are the number of PbEuTeSe and BiSb monolayers per superlattice period. For one superlattice structure the respective quantum barrier layers may be formed from electrical insulating material and the respective quantum well layers may be formed from semimetal material. For some applications superlattice structures with 10,000 or more periods may be grown. For example, the superlattice structure may comprise alternating layers of $(Pb_{1-y}Eu_yTe_{1-z}Se_z)_m$ and $(Bi_xSb_{1-x})_n$. According to one embodiment, the superlattice structure may comprise a plurality of layers comprising m layers of $(Pb_{1-y}Eu_yTe_{1-z}Se_z)_m$ and n layers of $Bi_{0.9}Sb_{0.1}$, where m and n are preferably between 2 and 20, grown on a $BaF_2$ substrate with a buffer layer of PbTe separating the substrate and the superlattice structure. For other applications the superlattice structure may be formed from alternating layers of $(Pb_{1-y}Eu_yTe_{1-z}Se_z)_m$ (quantum barrier layers) and $(Pb_{1-x}Sn_xTe_{1-y}Se_y)_n$ (quantum well layers)

48 Claims, 3 Drawing Sheets

U.S. PATENT DOCUMENTS

| | | | |
|---|---|---|---|
| 4,361,814 | 11/1982 | Soclof et al. | 330/4.9 |
| 4,368,416 | 1/1983 | James | 322/2 R |
| 4,457,897 | 7/1984 | Stanley et al. | 423/141 |
| 4,469,977 | 9/1984 | Quinn et al. | 310/334 |
| 4,620,897 | 11/1986 | Nakajima | 156/602 |
| 4,644,753 | 2/1987 | Burke | 62/3 |
| 4,664,960 | 5/1987 | Ovshinsky | 428/98 |
| 4,786,335 | 11/1988 | Knowles et al. | 136/214 |
| 4,847,666 | 7/1989 | Heremans et al. | 357/16 |
| 4,855,810 | 8/1989 | Gelb et al. | 357/87 |
| 4,869,971 | 9/1989 | Nee et al. | 428/635 |
| 4,999,082 | 3/1991 | Kremer et al. | 156/605 |
| 5,006,178 | 4/1991 | Bijvoets | 136/211 |
| 5,021,224 | 6/1991 | Nakajima | 422/248 |
| 5,051,786 | 9/1991 | Nicollian et al. | 357/4 |
| 5,064,476 | 11/1991 | Recine, Sr. | 136/201 |
| 5,156,004 | 10/1992 | Wu et al. | 62/3.1 |
| 5,181,086 | 1/1993 | Yoshida | 257/18 |
| 5,210,428 | 5/1993 | Goosen | 257/17 |
| 5,288,336 | 2/1994 | Strachan et al. | 136/200 |
| 5,415,699 | 5/1995 | Harman | 136/238 |
| 5,436,467 | 7/1995 | Elsner et al. | 257/15 |
| 5,439,528 | 8/1995 | Miller | 136/200 |
| 5,448,109 | 9/1995 | Cauchy | 257/719 |

OTHER PUBLICATIONS

Journal of Electronic Materials, vol. 22, No. 9, Aug. 1993, pp. 1165–1172, XP000646076, Harman T.C., "Controlled P–Type Sb Doping in LPE–Grown Hgl–XCDXTE Epilayers."

European Patent Search Report dated Dec. 8, 1997.

*High Thermoelectric Figures of Merit in PbTe Quantum Wells, Journal of Electronic Materials*, T.C. Harman, D.L. Spears and M.J. Manfra, Reprinted from JEM, vol. 25, No. 7, Jul. 1996, pp. 1121–1127.

"Solid–State Superlattices" by Gottfried H. Döhler, Nov. 1983, pp. 144–151.

T. E. Whall and E.H.C. Parker, "Preparation of Advanced Materials by Molecular Beam Epitaxy," in *Proc. First Europe Conf. on Thermoelectrics*, D.M. Rowe, ed. (Peter Peregrinus Ltd., London 1987) Chapter 5, pp. 51–63. No Month Available.

Katsuya Oda, et al., "Effects of Interface Atomic Configurations on Electronic Structures of Semiconductor Superlattices," *Jpn. J. Appln. Phys.*vol. 31 Part 1, No. 8, pp. 2359–2368, Aug. 1992.

Kaoru Inoue, et al., "Electron Mobilities in Modulation–Doped $Al_xGa_{1-x}As$/GaAs and Pseudomorphic $Al_xGa_{1-x}As$/$In_yGa_{1-y}$ As Quantum–Well Structures," *The American Physical Society*, vol. 47, No. 7, pp. 3771–3778, Feb. 1993.

Mark L. Biermann, et al., "Wave–Packet Theory of Coherent Carrier Dynamics in a Semiconductor Superlattice,"*The American Physical Society*, vol. 47, No. 7, pp. 3718–3717, Feb. 1993.

L.D. Hicks, et al., "Use of Quantum–well Superlattices to Obtain a High Figure of Merit from Non–conventional Thermoelectric Materials" *American Institute of Physics*, pp. 3230–3232, Dec. 1993.

G.D. Mahan, et al., "Thermoelectric Devices Using Semiconductor Quantum Wells" *American Institute of Physics*, pp. 1899–1901, Aug. 1994.

Mish, Frederick C., Ed.–in–chief, *Webster's Ninth New Collegiate Dictionary*, 1985, p. 1271.

SUPERLATTICE STRUCTURES PARTICULARLY SUITABLE FOR USE AS THERMOELECTRIC MATERIALS

RELATED APPLICATIONS

This application is a continuation of application Ser. No. 08/672,684, filed Jun. 28, 1996, entitled "Superlattice Structures Particularly Suitable for use as Thermoelectric Materials," by Theodore C. Harman, now abandoned; which is a continuation of application Ser. No. 08/355,842 filed Dec. 14, 1994, entitled "Superlattice Structures Particularly Suitable for Thermoelectric Materials" by Theodore C. Harman, now abandoned, which is a continuation-in-part patent application of U.S. application Ser. No. 08/002,451, filed Jan. 12, 1993 entitled "Superlattice Structures Particularly Suitable for use as Thermoelectric Cooling Materials," now U.S. Pat. No. 5,415,699.

U.S. GOVERNMENT INTEREST

This invention was developed pursuant to research sponsored in part by the U.S. Government under Department of the U.S. Air Force Contract No. F19628-90-C-0002, and the U.S. Government may have certain rights in the invention.

TECHNICAL FIELD OF THE INVENTION

The present invention relates to superlattice structures including buffer layer/insulator/semimetal structures and various alternatives that are particularly useful as thermoelectric materials.

BACKGROUND OF THE INVENTION

Superlattice structures, in general, are known and typically comprise a composite structure made from alternating ultrathin layers of different materials so that alternating barrier layers and quantum well layers are provided. Typically, the superlattice has an energy band structure which is different than, but related to, the energy band structure of the component materials.

Superlattices have many uses, including, but not limited to, use in the field of thermoelectric materials. Such materials may be used for various application including heating, cooling, power generation and temperature sensing. Whall and Parker have suggested using a superlattice prepared by molecular beam epitaxy (MBE) to enhance the thermoelectric figure of merit of a thermoelectric material. They expressed particular interest in silicon and SiGe alloys, but also mentioned the possibility of using PbTe, InAs and the transition silicides (e.g. $CoSi_2$). Specifically, a strained-layer superlattice consisting of 20 or more layers of Si and SiGe composition was suggested.

The use of MBE to grow superlattice structures (e.g., GaAs and AlAs) is disclosed in U.S. Pat. No. 4,261,771 issued to Dingle, et al. As disclosed in Dingle et al., the general technique for fabricating a superlattice by MBE comprises the following standard steps: (1) obtaining a substrate (e.g., from a commercial source); (2) cleaning a major surface of the substrate using standard preparation procedures; (3) placing the substrate in an evacuable metal chamber; (4) reducing the chamber pressure; (5) loading shuttered effusion cells (ovens) with the requisite source materials for growth; (6) heating the substrate to about 600 degrees C., to cause desorption of contaminants from the growth surface and then adjusting the substrate temperature to that desired for growth; (7) with the shutters closed, heating the ovens until the source materials vaporize; and (8) opening selected shutters to effect growth until the desired layer thickness is attained on the substrate.

According to Dingle et al., the fabrication process can be described as forming a new composition of matter of A (e.g., GaAs) and B (e.g., AlAs or Ge) by directing a periodically pulsed molecular beam at a substrate. During the first part of each period an A-beam is directed at the substrate for a time effective to grow material A having a thickness of n monolayers and during the second part of each period directing a B-beam at the substrate for a time effective to grow material B having a thickness of m monolayers.

Therefore, the fabrication of a superlattice by MBE, or other epitaxial growth techniques, is generally known. However, the materials and their relative amounts that make up the superlattice and substrate are predominant factors in determining the characteristics of the superlattice. For use as a thermoelectric material, it is desirable to choose the materials that make up the superlattice, and their relative amounts, so that the thermoelectric figure of merit is maximized.

The thermoelectric figure of merit (ZT) is a measure of the effectiveness of a material and is related to material properties by the following equation:

$$ZT = S^2 \sigma T / \kappa \tag{1}$$

where S, $\sigma$, $\kappa$, and T are the Seebeck coefficient, electrical conductivity, thermal conductivity and temperature, respectively. The Seebeck coefficient (S) is a measure of how readily electrons (or holes) can change energy in a temperature gradient as they move across a thermoelectric element, and is related to the strength of interaction of charge carriers with the lattice and the available energy states. The highest useful Seebeck coefficients are found in semiconductor materials with low crystal symmetry. In theory, to maximize ZT, one would try to maximize S, $\sigma$ and T and minimize $\kappa$. However, in practice, this is not so simple. For example, as a material is doped to increase its electrical conductivity ($\sigma$), bandfilling tends to lower S and the electron component $\kappa_e$ of $\kappa$ increases. In most materials, ZT is maximized at doping levels approaching $10^{19}$ cm$^{-3}$. Since increasing (or decreasing) one parameter may adversely increase (or decrease) another parameter, it is important to select carefully the component materials to provide a high ZT.

The figure of merit ZT is related to the thermoelectric materials factor (b*) where:

$$b^* = \mu m^{*3/2} / \kappa_L; \tag{2}$$

where $\mu$ is the carrier mobility, m* is the density of states effective mass and $\kappa_L$ is the lattice thermal conductivity. The precise relationship between b* and ZT is complex. However, for simplicity, it may be approximated as follows. If it is assumed that a**=b*$T^{5/2}$ and that there is one-band conduction, then ZT increases monotonically as a** increases.

A superlattice provides the opportunity to enhance ZT for a number of reasons. For example, it is known that the Seebeck coefficient increases as the period of a quasi-two-dimensional superlattice decreases. The electrical conductivity may be enhanced by means of modulation doping, which has been shown to increase the carrier mobilities in Si/SiGe strained-layer superlattices. Furthermore, the lattice thermal conductivity of a small or short-period superlattice structure is expected to be substantially lower than the average of the component materials because of augmented Umklapp phonon-phonon scattering process (in which the total phonon vector is not conserved, but rather changes by 2 π times the reciprocal lattice vector) due to phonon-interface scattering effects.

Multistage thermoelectric modules, which are used, for example, to cool different types of infrared imaging arrays (and for a number of other well known applications), are well known. Typically, however, they are limited to cold-sink temperatures greater than 160 K. Thermoelectric materials, for example, $Bi_2Te_3$ and BiSb were researched 30 to 40 years ago. Unfortunately, the best currently known production thermoelectric material, $Bi_2Te_3$, is not capable of efficient heat removal below approximately 180 K and has a ZT less than 1.

The use of various wide-bandgap semiconductor materials such as EuTe to form an electrical insulator is well known. Also, placing a buffer layer on a substrate to aid with various types of thin film layer growth on the surface of the substrate is a well known technique.

SUMMARY OF THE INVENTION

In accordance with the present invention, the disadvantages and problems associated with previous thermoelectric materials have been substantially reduced or eliminated. The present invention allows forming a high quality superlattice structure on a substrate to provide thermoelectric materials having an enhanced thermoelectric figure of merit (ZT). By the appropriate selection of materials, including substrate and buffer layer, according to the teachings of the present invention, a superlattice structure having a desired energy band structure and other thermoelectric characteristics can be produced.

One aspect of the present invention includes a superlattice structure comprising alternating layers of component materials which already have reasonably good thermoelectric characteristics. The selection of materials may include consideration of many variables such as band structure, electron affinity, lattice constant match, coefficient of thermal expansion match, and inherent thermoelectric properties (e.g., at 300 K) for the components of the superlattice structure. Also, materials may be selected to substantially minimize or eliminate diffusion and autodoping of the respective layers forming the superlattice structure. Another aspect of the present invention allows engineering a superlattice structure to produce thermoelectric materials having an optimal bandgap for the particular application. For some thermoelectric materials, an energy bandgap of between 0 and 8 kT, and preferably 4 kT, is desired, where k is Boltzmann's Constant and T is temperature. The optimum bandgap will result in the enhancement of transport effects of the desirable multi-valley L-conduction band and the elimination or minimization of the degrading effects of the extraneous T-valence band. For some applications the superlattice structure may be a short-period superlattice structure having two components which are not pseudomorphic but have slightly different crystal structures (e.g. face-centered cubic versus rhombohederal). For other applications the superlattice structure may be formed from two component materials having essentially the same crystal structure.

Important technical advantages of the present invention include providing a high structural quality barrier layer between a substrate and a superlattice structure to allow for the growth of a superlattice structure having an enhanced thermoelectric figure of merit. For some applications, the barrier layer may be formed from an electrical insulating material and the superlattice structure may be formed from alternating layers of electrical insulating material and a semimetal material. The buffer layer may be formed from various wide-bandgap semiconductor materials which have not been modified to be electrically conducting. Selected layers of the superlattice structure may also be formed from wide-bandgap semiconductor materials which have not been modified to be electrically conducting.

Further technical advantages of the present invention include providing a buffer layer between a substrate and a superlattice structure to substantially reduce dislocation densities during fabrication of the superlattice structure. For one application, the substrate may be formed from $BaF_2$ and the buffer layer may be formed from PbTe and the superlattice structure formed from alternating layers of PbEuTeSe and BiSb. For other applications, Pb may be replaced entirely by Eu to substantially increase the thermoelectric figure of merit of the resulting superlattice structure.

A further aspect of the present invention includes a superlattice structure which may be a compositionally modulated, periodic structure, consisting of alternate layers of two distinct phases (materials). The materials may consist of one semiconductor and one semimetal, two semiconductors, two semimetals, or an insulator and a semimetal. For some applications the superlattice structure may have a period with a thickness less than the electron (hole for p-type material) carrier mean free path. For purposes of the present invention, the term "period" is defined as the combined thickness of one quantum barrier layer and one adjacent quantum well layer of the associated superlattice structure. For purposes of the present invention, the terms "insulator" and "electrical insulating material" include the subset of wide-bandgap semiconductor materials that are not conducting when grown undoped and have not been modified to be conducting by impurity doping or crystalline imperfections. EuTe is an example of such semiconductor materials. The present invention allows selection of materials that make up a buffer layer between the superlattice structure and the substrate and selection of materials that make up the substrate to produce a high quality superlattice structure.

Further technical advantages of the present invention include providing a high structural quality buffer layer between the substrate and the superlattice structure for the growth of alternating material layers having a high thermoelectric figure of merit. A high structural quality buffer layer may be defined as a buffer layer which has a double-crystal x-ray differential (DCXRD) full-width half maximum (FWHM) valve on the order of 100 arc-sec or less. This buffer layer may often be important to overcome lattice mismatch between the superlattice structure and the associated substrate to allow forming the high structural quality superlattice structure with the desired enhanced thermoelectric properties. The buffer layer may be selected to reduce dislocations at the interface between the superlattice structure and the top surface of the buffer layer, which is also the last grown surface of the buffer layer. In one embodiment of the present invention, PbTe may be used as a buffer layer between the substrate and superlattice structure. Other materials may be substituted including but not limited to PbTe alloys such as $Pb_{1-y}Eu_yTe$.

According to another aspect of the present invention, a superlattice structure is synthesized from selected materials by epitaxial growth, for example, by using molecular beam epitaxy or organometallic vapor phase epitaxy (OMVPE). Depending on the choice of materials, other techniques such as liquid-phase epitaxy or sputtering may also be used as desired. Many parameters of the growth process may be optimized in accordance with the teachings of the present invention. These include, for example, impurity doping, layer thickness, deposition temperatures, growth rate, beam vapor pressures, etc. After the superlattice structure is grown, the buffer layer may function as a separation layer for removal of the superlattice structure from the substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiments of the present invention and its advantages are best understood by referring to FIGS. 1–6 of the drawings, like numerals being used for like and corresponding parts of the various drawings.

The present invention relates to novel superlattice structures which may be used for various purposes including fabricating thermoelectric elements for forming thermoelectric devices. A superlattice structure may be formed from alternating layers of various types of material in accordance with the teachings of the present invention to provide thermoelectric materials with desired operating characteristics. Thermoelectric materials having a superlattice structure in accordance with the teachings of the present invention may be used for heating, cooling, power generation and temperature sensing.

The superlattice structure should preferably have an energy potential provided by the layered structure, which significantly modifies the energy band structure of the respective component materials. Furthermore, the regular array of phase interfaces of the superlattice structure should preferably alter the phonon spectra so that the lattice thermal conductivity ($\kappa_L$) may also be lower than that of either component. Therefore, the basic physical properties of the resulting superlattice structure (such as thermopower, electrical resistivity and thermal conductivity) are different from the original materials and favorable for a high thermoelectric figure of merit (ZT).

Preferably, the superlattice structure includes component materials with a large number of relatively heavy atoms which are advantageous for the achievement of a low lattice thermal conductivity ($\kappa_L$). Preferably, the materials comprise elements chosen from the lower center section of the Periodic Table. Elements from the lower center section of the Periodic Table tend to have relatively large carrier mobilities ($\mu$), which is advantageous for high electrical conductivities ($\sigma$). The following table provides a listing of some of the elements which may be satisfactorily used to provide thermoelectric materials having a superlattice structure in accordance with the teachings of the present invention.

EXAMPLES OF ELEMENTS FOR FORMING A SUPERLATTICE STRUCTURE

| Designation | Periodic Table of Elements | General Characteristic | Selected Elements |
|---|---|---|---|
| L | Transition elements and Group II | Rare earth metal and alkaline earth metal | Europium (Eu) Strontium (Sr) Barium (Ba) Calcium (Ca) |
| M | Group IV | Metal | Lead (Pb) Tin (Sn) Germanium (Ge) |
| D | Group VI | Non-Metal Chalcogen | Tellurium (Te) Selenium (Se) Sulphur (S) |
| J | Group VI | Non-Metal Chalcogen | Tellurium (Te) Selenium (Se) Sulphur (S) |
| R | Group V | Semimetal | Bismuth (Bi) Antimony (Sb) Arsenic (As) Phosphorus (P) |

Figure 1:
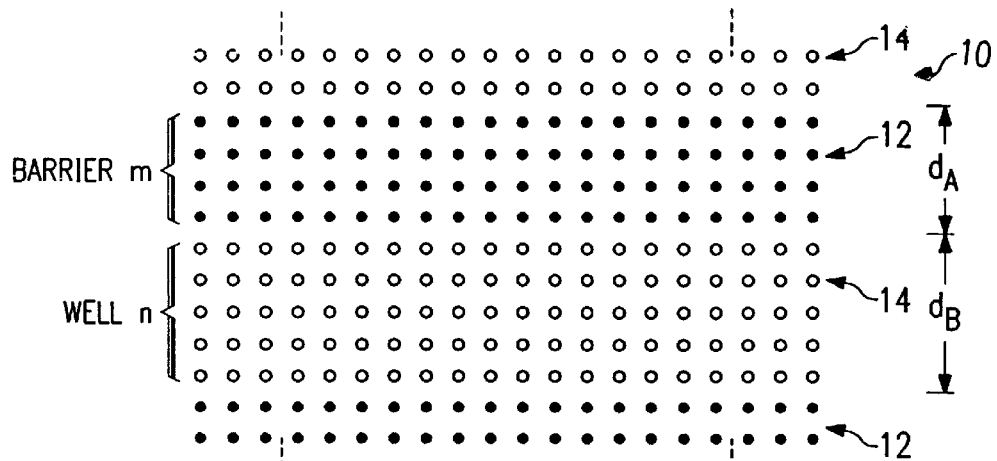
FIG. 1 is a schematic illustration of the monolayers forming two distinct material layers of a superlattice structure incorporating an embodiment of the present invention.

A schematic representation of monolayers m and n of superlattice structure 10 is shown in FIG. 1. Monolayers m represent quantum barrier layer 12 formed from various types of material in accordance with the teachings of the present invention. Monolayers n represent quantum well layer 14 formed from various types of material in accordance with the teachings of the present invention. For the specific example shown in FIG. 1, quantum barrier layer 12 has four monolayers m and quantum well layer 14 includes five monolayers n. The number of monolayers m and n within the respective quantum barrier layers 12 and quantum well layers 14 and the materials selected to form each monolayer m and n may be varied to provide the desired thermoelectric characteristics.

Superlattice structure 10 according to one aspect of the present invention may be made of alternating layers 12 and 14 of two distinct materials where one material comprises Bi, a Bi alloy or Bi and (at least one material selected from the group consisting of Pb, Sn, Ge, Te, Se, S, Sb, As or P) and where the other material comprises materials selected from the group consisting of Pb, Sn, Ge, Te, Se, S, Sb, As, P, or Eu. For example, but without limitation, superlattice structure 10 may be made of alternating layers 12 and 14 formed respectively from material $L_{1-y}M_yN_zO_{1-z}$, and $Bi_xR_{1-x}$;

where L is an element selected from the group consisting of Europium (Eu), Strontium (Sr), Barium (Ba), or Calcium (Ca); M is a metal selected from Group IV (preferably Pb, Sn or Ge), D is a non-metal selected from Group VI (preferably Te, Se or S), J is a non-metal selected from Group VI (preferably Te, Se or S), R is a Group V material (preferably Sb, As or P); and where $0 \leq x \leq 1$, $0 \leq y \leq 1$ and $0 \leq z \leq 1$.

The period for superlattice structure 10 is defined as the thickness of one quantum barrier layer 12 plus one adjacent quantum well layer 14. As will be discussed later in more detail, the number of monolayers within each quantum barrier layer and quantum well layer along with the total number of periods for each superlattice structure may be varied in accordance with the teachings of the present invention to provide the desired thermoelectric characteristics.

In the limit of layer thicknesses on the order of a few monolayers, the energy gap $E_g^{sl}$ of the associated superlattice structure 10 can be approximated by the equation:

$$E_g^{sl} = \{E_{gA}d_A + E_{gB}d_B\}/(d_A + d_B) \tag{3}$$

where $E_{gA}$ and $E_{gB}$ are the bandgap energies of the two materials (such as, PbEuTeSe and BiSb) forming layers 12 and 14, respectively, and $d_A$ and $d_B$ are the layer thicknesses, respectively. According to one embodiment, if it is desired that $E_g^{sl} \approx 0.1$ eV (which corresponds approximately to 4 kT at 300 K), then since $E_{gA}$ and $E_{gB}$ are 0.30 eV and –0.05 eV, respectively, the BiSb layer should be somewhat thinner than the PbEuTeSe layer. Often an even number of monolayers of PbEuTeSe is preferred to maintain stoichiometry. Therefore, if a superlattice period of nine monolayers is small enough to produce the desired energy band changes, superlattice structure 10 consisting of four monolayers of PbEuTeSe and five monolayers of BiSb should have optimal thermoelectric properties. The thickness of a monolayer in the (111) plane may be approximately 0.3692 and 0.3929 nm for PbEuTeSe and BiSb, respectively. For a period of nine monolayers (as specified above), $d_A=1.4768$ nm and $d_B=1.9645$ nm, and Equation (3) yields $E^{sl}=0.10$ eV.

The L-band extreme of BiSb is very favorable for high ZT in some applications, since it is highly anisotropic. Its low-effective-mass directions correspond to a high electron mobility ($\mu$), and its high-mass directions cause a relatively large density-of-states effective mass (m*). The high value of m* may lead to a high Seebeck coefficient because, for a fixed carrier concentration, the Fermi level energy decreases with increasing m*. Also, there are three equivalent L bands with three valley extreme belonging to the L-minima, which is favorable for high ZT because m* is directly proportional to the number of valleys. The T and H or $\Sigma$ valence bands of BiSb are less favorable because of their relatively low carrier mobilities and nearly isotropic nature (single valley). The deleterious effects of the T and H valence bands can be minimized substantially or eliminated by the use of a short-period superlattice structure such as PbEuTeSe/BiSb, so that the inherently high ZT value of the L conduction and valence bands of BiSb can be realized.

The L bands of PbEuTeSe are also favorable since they have good anisotropy and four equivalent valleys. Both PbEuTeSe and BiSb have low lattice thermal conductivities ($\kappa_L$) at 300 K. From a physics point of view, the BiSb/PbEuTeSe superlattice structure provides enhanced thermoelectric properties. In addition, from a crystal growth point of view BiSb/PbEuTeSe will often optimize thermoelectric material development. For example, the PbTe-PbSe pseudobinary system forms a continuous series of solid solutions. The liquidus and solidus part of the phase diagram typically forms a minimum at the composition of $PbTe_{0.8}Se_{0.2}$ where subscript v is approximately equal to 1 which is advantageous for the preparation of compositionally homogenous MBE source materials.

For some applications, superlattice structure 10 may be provided having one or more of the following characteristics: an energy bandgap of about 0–8 kT; a density of states effective mass of greater than 0.05, a lattice thermal conductivity less than 10 mWcm$^{-1}$ K$^{-1}$ and a b* greater than 40,000 cm$^3$KW$^{-1}$V$^{-1}$S$^{-1}$ (at 300 K). For example, to provide a superlattice structure with a ZT of approximately 3.2, it may have the following approximate 300 K properties: $\kappa_L = 0.0020$ W/cm K, $\kappa_e = 0.0022$ W/cm K, S=350 $\mu$V/K and $\sigma = 370$ $\Omega^{-1}$cm$^{-1}$.

For some applications, $Pb_{1-y}Eu_yTe_zSe_{1-z}$, the quantum barrier layer portion of the superlattice structure, may be considered an electrical insulator. This insulator is preferably selected to have an energy gap large enough to uncross the bands of the associated quantum well layer portion, $Bi_{0.9}Sb_{0.1}$, of the associated superlattice structure and convert the BiSb into a small-gap-semiconductor. BiSb is only one example of various semimetal materials that may be satisfactorily used to form quantum well layers 14 of superlattice structure 10 in accordance with the present invention. For this embodiment, all electron conduction will generally occur through the quantum well layers 14 ($Bi_{0.9}Sb_{0.1}$) of superlattice structure 10 and essentially none through the quantum barrier layers 12 ($Pb_{1-y}Eu_yTe_zSe_{1-z}$). The combination of an insulator/semimetal superlattice structure represents an important embodiment of the present invention which will be discussed later in more detail with respect to FIG. 5. In other embodiments, such as semiconductor/semimetal superlattice structures, conduction may occur through both the quantum barrier layers and quantum well layers of the associated superlattice structure.

Preferably, the average lattice constants of monolayers m and n of superlattice structure 10 are matched in the growth plane, but not necessarily in the direction perpendicular to the growth plane. Lattice matching in the growth plane will generally produce coherent growth and excellent thermoelectric transport properties due to the minimization of defects at the interfaces between quantum barrier layers 12 and quantum well layers 14. Superlattice structure 10, having quantum barrier layers 12 formed from PbEuTeSe and quantum well layers 14 formed from BiSb, is advantageous because it is lattice-matched in the (111) plane. For example, $Bi_{0.9}Sb_{0.1}$ and $Pb_{1-y}Eu_yTe_{1-z}Se_z$ alloys are lattice-matched at the expected superlattice structure growth temperature of about 250° C.

Forming superlattice structure 10 from alternating layers of BiSb (e.g. $Bi_{0.9}Sb_{0.1}$) and $Pb_{1-y}Eu_yTe_zSe_{1-z}$ (or similar materials) may be particularly advantageous for several reasons. For example, at low temperatures BiSb can have ZT values comparable to that of $Bi_2Te_3$ alloys at room temperature and PbEuTeSe is also a good thermoelectric material which may be lattice-matched to BiSb. Additionally, both PbEuTeSe and BiSb have multivalley conduction bands with relatively large density-of-states effective masses and favorable carrier-scattering mechanisms, which tend to yield unusually high Seebeck coefficients.

The $Pb_{1-y}Eu_yTe_zSe_{1-z}$ quantum barrier portion of the superlattice structure is also advantageous because it helps suppress inadvertent n-type BiSb autodoping of the associated quantum barrier layers and enhances the energy gap of the quantum barrier material. The substitution of europium for lead, or at least in part for lead, is advantageous because it appears to reduce interdiffusion and helps suppress inadvertent n-type doping of the barrier layers. Bi is one of the most efficient n-type dopants for PbTe.

Superlattice structure 10 may enhance ZT for several reasons. The short-range disorder and the multiplicity of interfaces associated with monolayers m and n increases the phonon scattering over the entire spectrum of phonon frequencies. Additionally, a large number of different heavy atoms (e.g. six for PbEuTeSe/BiSb) will act as mass point defects and scatter mainly high frequency phonons.

Furthermore, phonon-electron interactions will scatter the phonons mainly at low frequencies. The combined effects will substantially reduce the lattice component of the thermal conductivity ($\kappa_L$) and thereby increase ZT.

Moreover, superlattice structure 10 can be engineered to have an optimal bandgap, e.g., a value between the value of BiSb and the value for PbEuTSe, which will result in the enhancement of ZT because of the minimization of the harmful effects of the T valence band of BiSb. Additionally, both modulation doping effects and the long-range order of a good-quality superlattice structure enhance the electron carrier mobility and thus increase electrical conductivity, which will also increase ZT.

Figure 2:
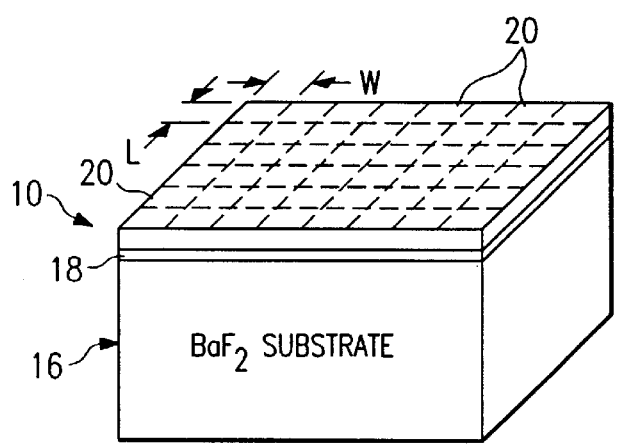
FIG. 2 is a schematic illustration showing one example of preparing chips from a superlattice structure for assembly into a bulk thermoelectric element.

As shown in FIGS. 1 and 2, superlattice structure 10 may comprise alternating layers 12 and 14 of various materials such as $(PbEuTeSe)_m$ and $(BiSb)_n$ where m and n are the number of PbEuTeSe and BiSb monolayers per superlattice structure period, respectively. For some applications, m and n will be between two and twenty. For other applications, superlattice structure 10 may have a small number of periods, n+m<50. However, superlattice structure 10 with 10,000 or more such periods may be grown.

Alternating layers 12 and 14 may be grown on $BaF_2$ substrate 16 with buffer layer 18 of PbTe disposed between substrate 16 and alternating layers 12 and 14. $BaF_2$ substrate 16 may have a crystal structure designated as (111). A high structural quality buffer layer 18 between superlattice structure 10 and substrate 16 will often overcome or substantially reduce lattice mismatch between superlattice structure 10 and substrate 16 and provides for a high structural quality superlattice structure 10, which is necessary for the desired enhanced thermoelectric characteristics. High structural quality is defined as a buffer layer with a double-crystal x-ray diffraction of (DCXRD) full-width half maximum (FWHM) value of 100 arc-sec or less.

Buffer layer 18 may be formed from PbTe and other materials such as PbEuTe. Various combinations and amouts of similar materials may be used. According to one embodiment, molecular beam epitaxy (MBE) may be used to grow $Pb_{1-y}EU_yTe_{1-z}Se_z$ and $Bi_{0.9}Sb_{0.1}$ on $BaF_2$ substrate 16 and PbTe buffer layer 18 at substrate temperature in the range of 100 to 250° C.

Figure 3:
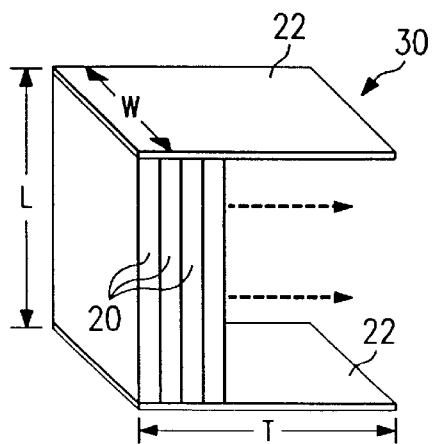
FIG. 3 is a schematic illustration showing a plurality of chips from the superlattice structure of FIG. 2 being assembled as a bulk thermoelectric element.
Figure 4:
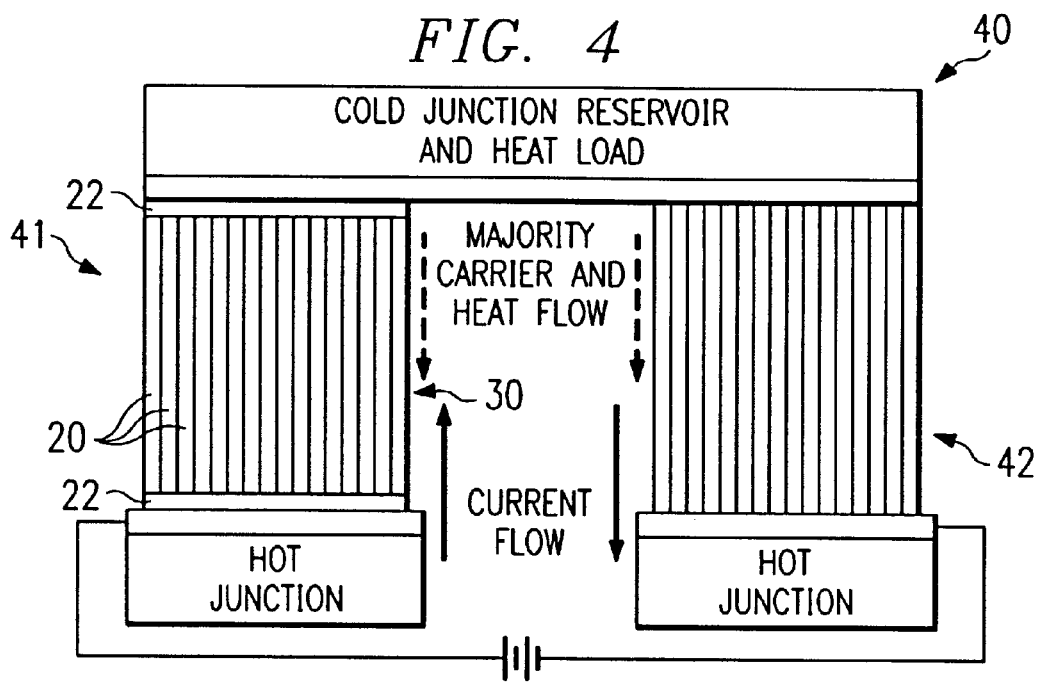
FIG. 4 is a schematic illustration of one example of a thermoelectric device incorporating a thermoelectric element fabricated from a superlattice structure in accordance with an embodiment of the present invention.

As shown in FIGS. 2, 3 and 4, superlattice structure 10 may be formed into bulk thermoelectric elements 30 for use in fabricating thermoelectric device 40. Superlattice structure 10 and at least a portion of buffer layer 18 may be removed from substrate 16 using well known techniques. Superlattice structure 10 may then be cut into chips 20 having a predetermined length L and a width W (e.g. 2×2 mm), followed by stacking and bonding chips 20 into small cubically-shaped thermoelectric elements 30 with a thickness T, as shown in FIG. 3. The thickness of each chip 20 corresponds approximately with the thickness of the associated superlattice structure 10.

For some applications, it may be desirable to form solder joints 22 along opposite sides of chips 20. As best shown in FIGS. 2 and 3, each chip 20 and its associated alternating layers 12 and 14 are oriented substantially horizontal with respect to substrate 16 and substantially vertical with respect to solder joint 22. This change in orientation between FIGS. 2 and 3 may be used to further enhance the thermoelectric properties of the resulting thermoelectric element 30.

As best shown in FIG. 3, the length and width of thermoelectric element 30 corresponds approximately to the length and width of the associated chips 20. The thickness T of thermoelectric element 30 is approximately equal to the number of chips 20 time the thickness of each chip 20.

Thermoelectric device 40 may be then fabricated from one or more thermoelectric elements 30. The use of BiSb to form superlattice structure 10 provides n-type thermoelectric element 30 which may be used as the n-type leg 41 of thermoelectric device 40, as shown in FIG. 4. Thermoelectric device 40 using this new type of material may be used for various purposes, including, for example, commercial refrigeration and air-conditioning equipment, the development of cryogenic coolers for infrared thermal imaging, superconductive electronics, and other quantum device applications.

While multiple pairs of n-type and p-type thermoelectric elements are typically required in each stage of a multistage cryogenic cooler, it may not be necessary to develop a new p-type leg for high-performance thermoelectric devices. For example, in view of the superiority of the n-type thermoelements 30, the p-type leg 42 of FIG. 4 may be replaced by a passive thermoelectric element, e.g., one that has close to zero Seebeck coefficient but which has a high ratio of electrical to thermal conductivity. It is known that the Seebeck coefficient is zero in superconductors but the ratio of the electrical to thermal conductivity is infinite. Consequently, a thermoelectric device fabricated from n-type thermoelectric elements 30 formed from superlattice structure 10 and a superconductor will have a ZT corresponding precisely to that of superlattice structure 10.

A multistage cryogenic cooler using n-type thermoelectric materials from superlattice structure 10 can be made with stages operating above ~120 K having p-type legs of conventional $Bi_2Te_3$ or BiSb alloys (or other suitable material) and still have an effective ZT of 2.1 and stages operating below ~120 K having superconductor legs and have an effective ZT of 3.2. Thus, a matching p-type superlattice structure leg may not be needed to provide a 300 to 77 K thermoelectric cooler.

The realization of a ZT of 3.2 over the entire multistage cooler temperature range is adequate to accomplish thermoelectric cooling from room temperature to 77 K. It will also greatly expand the commercial refrigeration and cooling applications for thermoelectric devices.

U.S. Pat. No. 4,855,810, entitled Thermoelectric Heat Pump and U.S. Pat. No. 5,064,476, entitled Thermoelectric Cooler and Fabrication Method, disclose various procedures and techniques which may be satisfactorily used to fabricate thermoelectric device 40 from thermoelectric materials resulting from superlattice structure 10. U.S. Pat. Nos. 4,855,810 and 5,064,476 are incorporated by reference for all purposes within this patent application.

Although PbEuTeSe/BiSb was discussed as one combination of materials, various other combinations of materials are within the scope of the invention. Specifically, other materials that exhibit characteristics similar to the advantageous characteristics discussed above are within the scope of the invention. In general, it is preferred that at least one of the layers comprise PbEuTeSe, PbTe, SnSe, SnTe, TeSe, $Bi_2Te_3$, Bi, BiSb or their alloys. Without limiting the invention, the following are some specific examples of combinations of materials which may also be used:

Bi and $Bi_2Te_3$ $Bi_{0.88}Sb_{0.12}$ and Bi $Bi_{0.87}Sb_{0.12}As_{0.01}$ and $Bi_{0.93}Sb_{0.06}As_{0.01}$ $Bi_2Te_3$ and PbTe SbTe and BiTe (or another Bi alloy)

AgSbTe and BiSb (or another Bi alloy)

CdSb and BiSb (or another Bi alloy)

Figure 5:
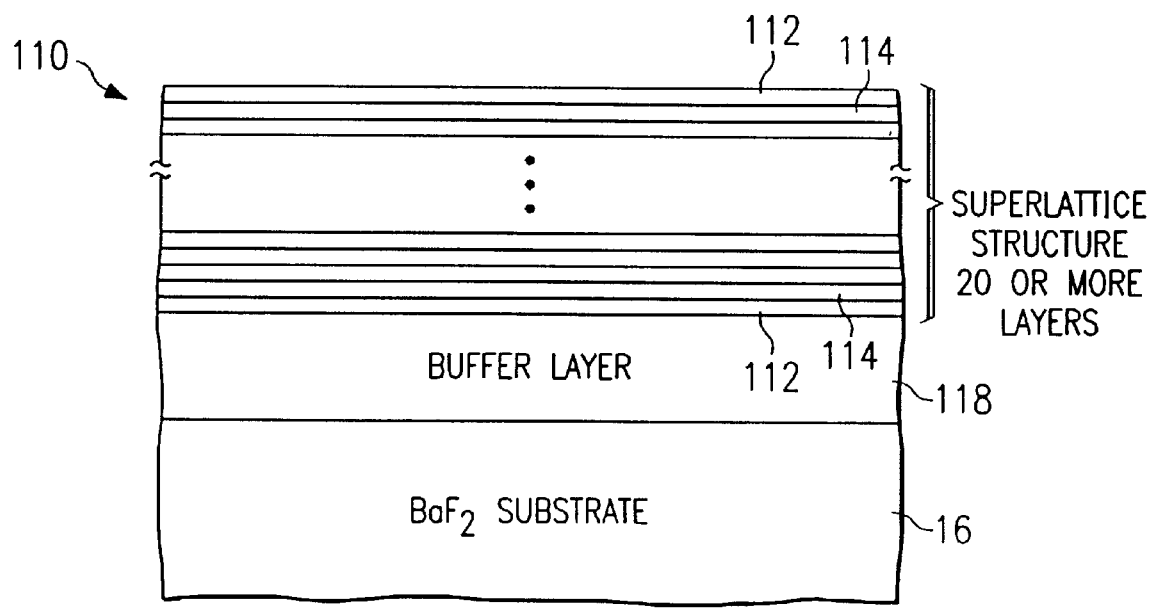
FIG. 5 is an enlarged illustration with portions broken away showing alternating material layers forming a superlattice structure on a buffer layer and a substrate in accordance with an embodiment of the present invention.

Superlattice structure 110 as shown in FIG. 5 represents an alternative embodiment of the present invention. Contrary to semiconductor/semimetal, semiconductor/semiconductor, and semimetal/semimetal superlattice structures, which form other embodiments of the present invention, quantum barrier layers 112 of superlattice structure 110 are preferably formed from electrical insulating material. Quantum well layer 114 is preferably formed from semimetal material. Thus, essentially all electron conduction will occur only through the quantum well layer 114 of superlattice structure 110.

For purposes of the present invention, semimetal materials are defined to include the graphite form of carbon and the conducting pentavalent (Group VI) elements. Semimetals represent substantially different materials as compared to semiconductors. A pure semimetal at T=0 is a conductor with partially filled electron and hole bands. A semiconductor, however, conducts only because carriers are either thermally excited or introduced by impurities. A pure semiconductor at T=0 is an insulator. Semimetals are materials in which the carrier concentration is several orders of magnitude lower than the $10^{22}/cm^3$ typical of ordinary metals. Many chalcogenide compounds provide satisfactory semimetal materials for use with the present invention.

Various epitaxial growth techniques such as molecular beam epitaxy or organometallic vapor phase epitaxy may be used to form superlattice structure 110 on substrate 16 with buffer layer 118 disposed therebetween. One advantage resulting from forming substrate 16 from $BaF_2$ includes the wide variety of superlattice structures and/or buffer layers which may be satisfactorily formed thereon. For some applications, substrate 16 may be a cleaved or polished single crystal of $BaF_2$ with a (111) granite cleavage plane. $BaF_2$ also has a lattice constant of 6.200 Å at room temperature which is relatively close to the lattice constant of both PbEuTeSe and BiSb (in its trigonal orientation). $BaF_2$ substrates have also demonstrated a low DCXRD FWHM of approximately 50 arc-sec. Thus, $BaF_2$ provides a particularly suitable substrate 16 for use with BiSb/PbEuTeSe and other superlattice structures for forming thermoelectric materials.

For some applications, a relatively thin buffer layer 18 may be formed on the surface of substrate 16. For other applications, a relatively thick buffer layer 118 may be formed on the surface of substrate 16. The present invention allows varying both the thickness and the type of materials used to form buffer layers 18 and 118 to allow growing the associate superlattice structures 10 and 110 with the desired thermoelectric characteristics. For some applications, buffer layer 118 may be formed from PbTe. For other applications, buffer layer 118 may be formed from various types of electrical insulating material such as a wide band gap semiconductor material.

Although $EuTe_{1-x}Se_x$ is a wide-band-gap semiconductor with a 2 eV energy gap, undoped $EuTe_{1-x}Se_x$ is currently considered an insulator since the electrical resistivity at 300 K is $10^6$–$10^7$ Ohm-cm, at least for the EuTe portion of the ternary compound. Although Eu metal is expensive, low cost elements that form tellurides with a face centered cubic crystal structure may be substituted. These include, but are not limited to, alkaline earth metals such as calcium, strontium, and barium.

Superlattice structure 110 may be easily removed from substrate 16 and the associated buffer layer 118 by one or more well known techniques. As shown in FIG. 5, superlattice structure 110 preferably includes alternating quantum barrier layers 112 and quantum well layers 114. For some applications, a quantum barrier layer 112 is first formed on buffer layer 118 followed by quantum well layer 114. For other applications, a quantum well layer 114 may be formed on buffer layer 118 followed by quantum barrier layer 112. The sequence of forming either quantum barrier layer 112 or quantum well layer 114 on buffer layer 118 depends in part upon lattice matching and potential autodoping of the respective component materials.

The conduction band and valence band of the semimetal materials used to form quantum well layers 112 have either zero separation or an overlap between the respective conduction band and valence band. For Bi and BiSb, the conduction band and valence band actually overlap so that with a perfectly formed quantum well layer 112 having no impurities or lattice defects, induction electrons and/or holes are present at a temperature of absolute zero. Thus, BiSb is an example of a semimetal material particularly satisfactory for use with the present invention.

By forming superlattice structure 110, in accordance with the teachings of the present invention, semimetal materials such as BiSb which normally has no energy gap between the conducting and valence bands may be converted in to a small band gap semiconductor. For one application BiSb is provided with a small energy gap of approximately 4 KT at room temperature. The present invention allows scaling the energy gap of the respective quantum well layers formed from semimetal material to vary proportionally with changes in temperature.

For some applications, quantum well layer 114 may be formed from $Pb_{1-x}Sn_xTe$, $Pb_{1-x}Sn_xSe$, or $Pb_{1-x}Sn_xTe_{1-z}Se_z$, which demonstrate various characteristics associated with semimetal materials, and minimize autodoping of quantum barrier layer 112 formed from PbEuTeSe. Specifically, $Pb_{0.437}Sn_{0.563}Te$, $Pb_{0.7}Sn_{0.3}Se$, and some compositions of $Pb_{1-x}Sn_xTe_{1-z}Se_z$ may be satisfactorily used to form superlattice structure 110.

Superlattice structure 110 provides a unique opportunity to create made-to-order energy gaps, phonon spectra and Fermi surfaces by controlling the energy and bandwidth of the alternating layers 112 and 114 of electrical insulating material and semimetal material respectively, which determine the respective quantum barrier and quantum well thicknesses and the energy barrier height. The thickness of layers 112 and 114 are adjustable MBE growth parameters, whereas the energy barrier height can be varied by choosing closely related pseudobinary alloys, such as PbEuTeSe, PbSrTeSe, etc.

The relationship between the molecular beam flux monitoring pressure and the epitaxial growth rate for both PbEuTeSe and BiSb has been calculated and measured experimentally to be the following:

$$G_r(\mu m/hr) = P(Torr)/2 \times 10^{-6} \quad (4)$$

where $G_r$ is the epitaxial growth rate and P is the beam flux monitoring vapor pressure. The above equation is typically applicable in the 1 to 3 $\mu$m/hr range. The calculated growth rates compare reasonably well with those obtained by cleaving the MBE grown layers and using an optical microscope to measure the layer thickness. The measured growth rate may be calculated as the ratio of the layer thickness to the growth time.

Preferably, superlattice structure 110 will have carrier concentrations less than $1 \times 10^{18} cm^3$. The relatively low carrier concentrations are preferable for at least the BiSb component of the superlattice structure for high Seebeck coefficients (>350 $\mu V/K$ at 300 K). High carrier mobilities are preferred for high electrical conductivity (>350 $\mu^{-1}cm^{-1}$ at 300 K).

The interdiffusion coefficient of PbEuTeSe/BiSb should be small because the six different atoms are large and diffuse substitutionally rather than interstitially. Nevertheless, knowledge of the diffusion coefficient is important for setting upper limits on the epitaxial growth temperatures and on thermal process times and temperatures. Secondary-ion-mass spectroscopy may also be used to assess impurity cross-contamination.

For the case of an insulator/semimetal superlattice structure with an insulating quantum barrier designated as component A and a semimetal quantum well designated as component B, the respective component materials may be selected based on the following criteria.

Component A of the quantum barrier should have a large enough energy bandgap so that the bands of the quantum well component B such as $Bi_xSb_{1-x}$ or any other semimetal are uncrossed and yield a superlattice structure energy bandgap in a desirable range for the particular application. Both components A and B should have as low a lattice thermal conductivity as possible for the thermoelectric application. Components A and B should have favorable surface free energies for epitaxial growth so that component A can grow two-dimensionally on component B and component B can grow two-dimensionally on component A, i.e. atom layer by atom layer growth as shown in FIG. 1, rather than island or three-dimensional growth.

None of the elements of component B should dope component A and vice versa. The lattice constant of component A should be matchable to the lattice constant of component B and the coefficient of thermal expansion should be approximately matched for components A and B. The classes of materials that come closest to satisfying all of the above criteria are the $Pb_{1-x}Sn_x$, rare-earth and alkali-earth chalcogenides with the face-centered cubic (FCC) crystal structure for the barrier component A. Some compositions of $Pb_{1-x}Sn_xTe_{1-y}Se_y$, elements Bi,Sb,As, and P and alloys from Column VA of the Periodic Table are preferred examples for the semimetal component B. Potential barrier layer binary components include, but are not limited to: $Pb_{1-x}Eu_xTe$, EuTe, EuSe, SrTe, SrSe, BaTe, and CaTe.

EXAMPLES OF QUANTUM BARRIER MATERIALS

| Material | Energy Gap (eV) | Lattice Parameter (Å) | Thermal Conductivity at 300 K. (mW/Cm-K.) |
|---|---|---|---|
| EuTe | 2.0 | 6.598 | n.m. |
| EuSe | 2.0 | 6.190 | 2.4 |
| SrTe | 4.3 | 6.659 | n.m. |
| SrSe | 4.3 | 6.243 | n.m. |
| BaTe | 3.6 | 7.000 | n.m. |
| CaTe | 4.5 | 6.359 | n.m. | where n.m. means not measured

The above list of materials share the same face centered cubic crystal structure with lattice parameters that are comparable to those of the (111) plane or growth plane of the slightly distorted face-centered cubic $Bi_xSb_{1-x}$ alloys, and are very stable in the +2 valence state. Thus, insulator/semimetal superlattice combinations may be particularly useful to form thermoelectric materials, especially if they satisfy most or all of the above list of criteria for the ideal quantum well and quantum barrier materials. Superlattice structures may be formed from PbTe/PbEuTe and EuTe/Bi in accordance with the teachings of the present invention.

Figure 6:
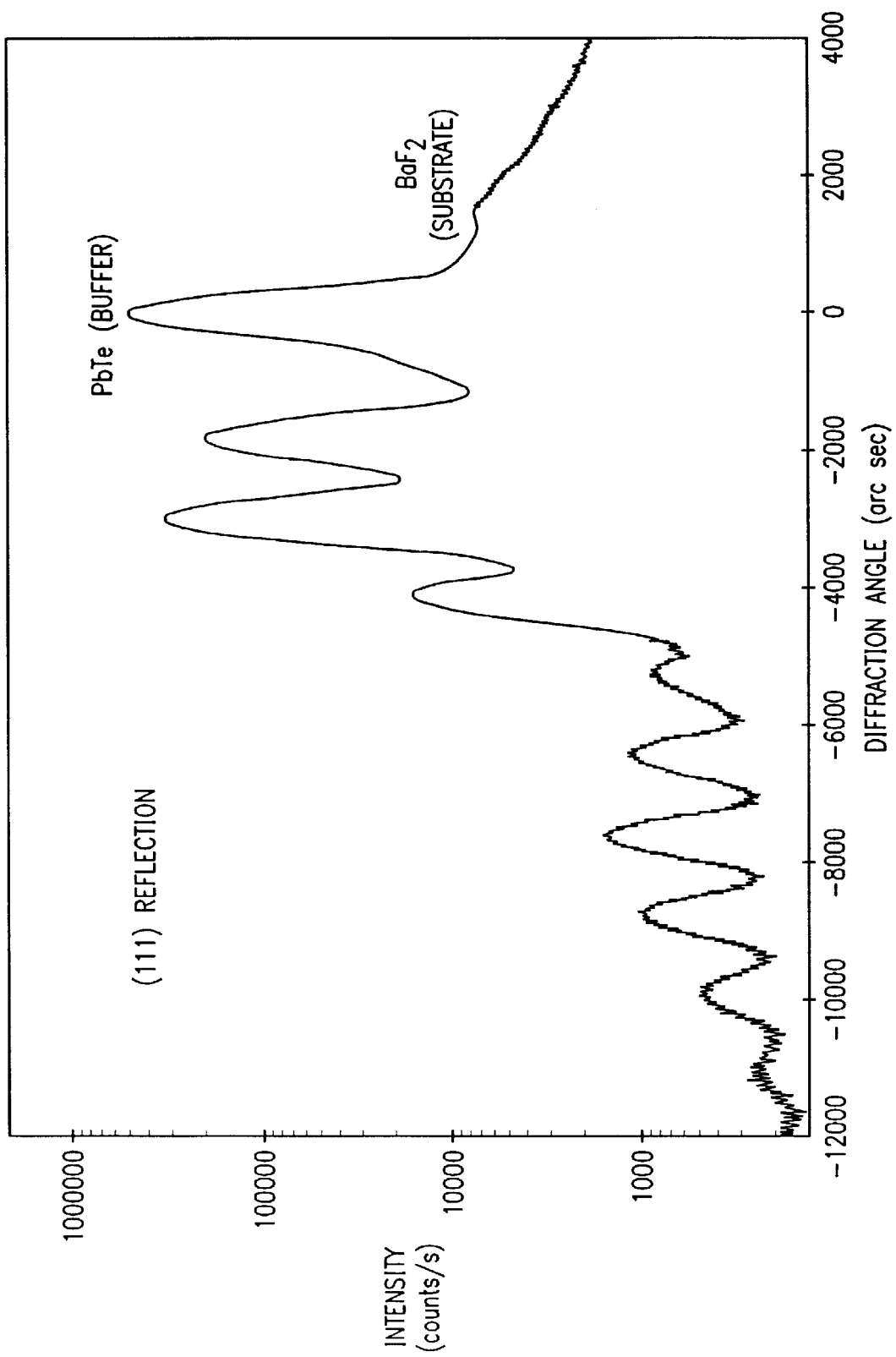
FIG. 6 is a graph of a single crystal x-ray diffraction for a EuTe/Bi superlattice structure formed on a PbTe buffer layer and a BaF$_2$ substrate in accordance with the teachings of the present invention.

FIG. 6 shows a single crystal X-ray diffraction pattern of a EuTe/Bi superlattice formed on a PbTe buffer and $BaF_2$ substrate in accordance with the teachings of the present invention. The PbTe buffer layer preferably has a FWHM value of 60 to 70 arc-sec. The various peaks in the graph of FIG. 6 demonstrate the high structural quality of the associated superlattice structure and the high structural quality of the PbTe buffer layer. Double crystal x-ray diffraction techniques have also been satisfactorily used to evaluate structural quality of various superlattice structures.

ABBREVIATIONS AND SYMBOLS

| | |
|---|---|
| Molecular Beam Epitaxy | MBE |
| Double-crystal x-ray diffraction | DCXRD |
| Full-width half-maximum | FWHM |
| Seebeck Coefficient | S |
| Boltzmann's Constant | k |
| Electrical conductivity | $\sigma$ |
| Thermal conductivity | K |
| Electron component of thermal conductivity | $K_e$ |
| Lattice thermal conductivity | $K_L$ |
| Carrier mobility | $\mu$ |
| Density of states effective mass | m* |
| Temperature | T |
| Thermoelectric figure of merit | ZT |
| Face centered cubic | FCC |

Although the present invention and its advantages have been described in detail, it should be understood that various changes, substitutions and alterations can be made therein without departing from the spirit and scope of the invention as defined by the appended claims.

What is claimed is:

1. A superlattice structure formed on a substrate comprising:

a plurality of thin quantum barrier layers formed from material $L_{1-y}M_yD_zJ_{1-z}$ alternating with a plurality of thin quantum well layers formed from material $Bi_xR_{1-x}$;

wherein L is an element selected from the group consisting of Eu, Sr, Ba, and Ca;

M is a Group IV metal selected from the group consisting of Pb, Sn, and Ge;

D is a Group VI non-metal selected from the group consisting of Te, Se, and S;

J is a Group VI non-metal selected from the group consisting of Te, Se and S;

R is a Group V element;

D is not the same as J;

$0 \leq x \leq 1$; $0 \leq y \leq 1$; $0 \leq z \leq 1$;

the quantum barrier layers comprising electrical insulating material which is essentially nonconducting resulting in essentially all electrical current flowing only through the quantum well layers; and a buffer layer disposed between the substrate and the alternating layers of the superlattice structure.

2. The superlattice structure of claim 1 wherein the buffer layer further comprises an electrical insulator.

3. The superlattice structure of claim 1 wherein the buffer layer further comprises an electrical insulator formed from a wide-bandgap semiconductor material.

4. The superlattice structure of claim 1 wherein the substrate comprises $BaF_2$.

5. The superlattice structure of claim 1 wherein the buffer layer comprises material selected from the group consisting of PbTe and $Pb_{0.97}Eu_{0.3}Te$.

6. The superlattice structure of claim 1 wherein the buffer layer comprises PbTe and the substrate comprises $BaF_2$.

7. The superlattice structure of claim 1 wherein the buffer layer has a double crystal x-ray diffraction full width half maximum value of 100 arc-seconds or less.

8. The superlattice structure of claim 1 having at least one of the following properties:

a density of states effective mass less than 0.05;

a lattice thermal conductivity less than 10 $mWcm^{-1}K^{-1}$; and a materials factor (b*) greater than 40,000 $cm^{-3}kW^{-1}V^{-1}S^{-1}$.

9. A superlattice structure of claim 1 wherein layers $L_{1-y}M_yD_zJ_{1-z}$ comprises a wide-bandgap semiconductor material that is nonconducting when grown undoped and has not been modified by impurity doping or crystalline imperfections to be conducting.

10. The superlattice structure of claim 1 wherein layers $L_{1-y}M_yD_zJ_{1-z}$ comprises:
   $pb_{-y}Eu_yTe_zSe_{1-z}$;
   $0 \leq y \leq 1$;
   $0 \leq z \leq 1$;
   R is Sb.

11. The superlattice structure of claim 1 wherein layers $L_{1-y}M_yD_zJ_{1-z}$ comprises:
   $Pb_{1-y}Eu_yTe_zSe_{1-z}$;
   $0 \leq y \leq 1$;
   $0 \leq z \leq 1$;
   R is Sb; and
   Bi has a subscript of approximately 0.9 and Sb has a subscript of approximately 0.1.

12. The superlattice structure of claim 1 wherein the alternating layers of material have a face centered cubic crystal structure.

13. A superlattice structure comprising:
   alternating layers of two component materials;
   wherein one of the component materials consists essentially of an electrical insulating material and another of the component materials consists essentially of a semimetal material; and
   wherein the electrical insulating material comprises $Pb_{1-y}Eu_yTe_zSe_{1-z}$ with $0 \leq y \leq 1$, $0 \leq z \leq 1$ and the semimetal comprises $Bi_xSb_{1-x}$, $0 \leq x \leq 1$.

14. A superlattice structure comprising:
   alternating layers of two component materials;
   wherein one of the component materials consists essentially of an electrical insulating material and another of the component materials consists essentially of a semimetal material; and
   wherein the electrical insulating material layers comprises $EuTe_{1-x}Se_x$ with $0 \leq x \leq 1$.

15. A superlattice structure comprising:
   alternating layers of two component materials;
   wherein one of the component materials consists essentially of an electrical insulating material and another of the component materials consists essentially of a semimetal material; and
   wherein the semimetal material comprises $Bi_xSb_{1-x}$ with $0 \leq x \leq 1$.

16. A superlattice structure comprising:
   alternating layers of two component materials;
   wherein one of the component materials consists essentially of an electrical insulating material and another of the component materials consists essentially of a semimetal material;
   wherein the electrical insulating material further comprises quantum barrier layers and the semimetal material comprises quantum well layers alternating with respect to the quantum barrier layers; and
   wherein the quantum barrier layers further comprise europium.

17. A superlattice structure comprising:
   alternating layers of two component materials;
   wherein one of the component materials consists essentially of an electrical insulating material and another of the component materials consists essentially of a semimetal material;
   wherein the electrical insulating material further comprises quantum barrier layers and the semimetal material comprises quantum well layers alternating with respect to the quantum barrier layers; and
   wherein the quantum barrier layers comprise alkaline earth metals selected from the group consisting of strontium, barium, and calcium.

18. A superlattice structure comprising:
   alternating layers of two component materials;
   wherein one of the component materials consists essentially of an electrical insulating material and another of the component materials consists essentially of a semimetal material; and
   wherein the semimetal material comprises $Pb_{1-x}Sn_xTe_{1-y}Se_y$ with $0.15 \leq x \leq 0.85$ and $0 \leq y \leq 1$.

19. An n-type thermoelectric element for fabricating a thermoelectric device having a superlattice structure comprising alternating m layers of PbEuTeSe and n layers of BiSb where m is less than n.

20. The n-type thermoelectric element of claim 19 wherein the superlattice structure further comprises m=4 and n=5.

21. The n-type thermoelectric element of claim 19 wherein the superlattice structure further comprises m and n having a range from 2 to 20 and m is less than n.

22. The superlattice structure The n-type thermoelectric element of claim 19 wherein the superlattice structure further comprises the alternating layers formed on a buffer layer disposed between the alternating layers and a substrate.

23. The n-type thermoelectric element of claim 22 wherein the superlattice structure further comprises the buffer layer consisting of PbTe and the substrate comprises $BaF_2$.

24. The n-type thermoelectric element of claim 22 wherein the superlattice structure further comprises the alternating layers consisting essentially of:
   $Pb_{1-y}Eu_yTe_zSe_{1-z}$;
   $0 < y < 1$;
   $0 < z < 1$; and
   $Bi_{0.9}Sb_{0.1}$.

25. The n-type thermoelectric element of claim 22 wherein the superlattice structure further comprises the buffer layer comprises having a thickness of approximately 5 $\mu$m and the superlattice structure having a thickness of approximately 0.25 $\mu$m.

26. The superlattice structure The n-type thermoelectric element of claim 22 wherein the superlattice structure further comprises the buffer layer consisting essentially of $Pb_{1-y}Eu_yTe$ with $0 \leq y \leq 1$.

27. An n-type thermoelectric element having a superlattice structure for use in fabricating thermoelectric devices comprising a plurality of alternating layers of:
   $L_{1-y}M_yD_zJ_{1-z}$ and
   $Bi_xR_{1-x}$;
   where L is a material selected from the group consisting of Europium and Strontium;
   M is T Croup IV selected from the group consisting of Pb, Sn and Ge;
   D is a Group VI non-metal selected from the group consisting of Te, Se and S;
   J is a Group VI non-metal selected from the group consisting of Te, Se and S;

R is a Group V material; D is not the same as J; $0 \leq x \leq 1; 0 \leq y \leq 1$; and $0 \leq z \leq 1$.

28. The thermoelectric element of claim 27 wherein the superlattice structure further comprises an energy gap between 0 kT and 10 kT:
    where k is Boltzman's constant and T is temperature.

29. The thermoelectric element of claim 27 wherein the superlattice structure further comprises at least one of the following properties:
    a density of states effective mass less than 0.05;
    a lattice thermal conductivity less than 10 mWcm$^{-1}$K$^{-1}$ and a materials factor (b*) greater than 40,000 cm$^{-3}$kW$^{-1}$V$^{-1}$S$^{-1}$.

30. The thermoelectric element of claim 27 wherein the superlattice structure further comprises a thermoelectric figure of merit greater than approximately 1.7.

31. The thermoelectric element superlattice of claim 27 wherein the superlattice structure further comprises a thermoelectric figure of merit greater than approximately 2.0.

32. The thermoelectric element of claim 27 wherein the superlattice structure further comprises a thermoelectric figure of merit greater than approximately 2.5.

33. The thermoelectric element of claim 27 wherein the superlattice structure further comprises a thermoelectric figure of merit greater than approximately 3.0.

34. The thermoelectric element of claim 27 wherein the superlattice structure further comprises a thermoelectric figure of merit approximately equal to 3.2.

35. The thermoelectric element of claim 27 wherein the superlattice structure further comprises the respective $L_{1-y}M_yD_zJ_{1-z}$ and $Bi_xR_{1-x}$ layers are grown on a substrate and are lattice matched in a plane perpendicular to the direction of growth.

36. The thermoelectric element of claim 27 wherein subscript y is approximately equal to and no greater than 1, D comprises Te and J comprises Se.

37. The thermoelectric element of claim 36 wherein the superlattice structure further comprises M consisting of Pb, and D has a subscript of approximately 0.8 and J has a subscript of approximately 0.2.

38. The thermoelectric element of claim 37 wherein the superlattice structure further comprises R consisting of Sb.

39. The thermoelectric element of claim 38 wherein the superlattice structure further comprises Bi having a subscript of approximately 0.9 and R having a subscript of approximately 0.1.

40. A short-period superlattice structure for an n-type thermoelectric element used for forming a thermoelectric device comprising at least one period of alternating m layers of PbTeSe and n layers of BiSb where m is less than n.

41. The superlattice of claim 40 where m=4 and n=5.

42. The superlattice of claim 40 where $2 \leq m \leq 20$ and $2 \leq n \leq 20$.

43. A short-period superlattice structure for an n-type thermoelectric element used for forming a thermoelectric device comprising:
    a plurality of epitaxially grown alternating layers of materials A and B, where A and B are substantially lattice matched in a direction perpendicular to the direction of growth and are formed from materials which provide a thermoelectric figure of merit greater than 1.7; and
    the thickness of the layers of materials A and B and the number of layers of materials A and B within a period of the superlattice are formed such that $E_g^{s1}$ is approximately in the range of 0 kT to 8 kT, where k is Boltzman's constant, T is temperature and $$E_g^{sl} = \{E_{gA}d_A + E_{gB}d_B\}(d_A + d_B);$$

where $E_g^{sl}$ is the energy gap of the superlattice, $E_{gA}$ and $E_{gB}$ are the energy gaps of materials A and B, respectively, and $d_A$ and $d_B$ are the layer thicknesses of materials A and B, respectively.

44. A thermoelectric device having a plurality of thermoelectric elements comprising:
    at least a portion of the thermoelectric elements having a superlattice structure formed from alternating quantum barrier layers and quantum well layers;
    the quantum barrier layers formed from material $L_{1-y}M_yD_{z1-z}$;
    the quantum well layers formed from material $Bi_x R_{1-x}$;
    wherein L is an element selected from the group consisting of Eu, Sr, Ba, and Ca;
    M is a Group IV metal selected from the group consisting of Pb, Sn, and Ge;
    D is a Group VI non-metal selected from the group consisting of Te, Se, and S;
    J is a Group VI non-metal selected from the group consisting of Te, Se and S;
    R is a Group V element;
    D is not the same as J;
    $0 \leq x \leq 1; 0 \leq y \leq 1; 0 \leq z \leq 1$; and
    the quantum barrier layers comprising electrical insulating material which is essentially nonconducting resulting in essentially all electrical current flowing only through the quantum well layers.

45. The thermoelectric device of claim 44 further comprising n-type and p-type thermoelectric elements.

46. The thermoelectric device of claim 44 further comprising:
    at least one leg formed from n-type thermoelectric materials; and
    another leg formed from superconducting materials.

47. A superlattice structure formed on a substrate for use in fabricating thermoelectric elements for use in a thermoelectric device having an enhanced figure of merit, comprising:
    a buffer layer of $Pb_{1-y}Eu_y$Te formed on one surface of the substrate wherein $0 \leq y \leq 1$;
    a plurality of alternating barrier layers and quantum well layers formed on the buffer layer opposite from the substrate with each barrier layer comprising $Pb_{1-y}Eu_y$Te wherein $0 \leq y \leq 1$ and each quantum well layer comprising PbTe; and
    the superlattice structure extending generally uniformly from the buffer layer through the alternating barrier layers and quantum well layers.

48. The superlattice structure of claim 47 wherein the substrate further comprises $BaF_2$.

* * * * *